(12) United States Patent
Lechleiter et al.

(10) Patent No.: US 9,508,905 B2
(45) Date of Patent: Nov. 29, 2016

(54) CIRCUIT FOR A LIGHT EMITTING COMPONENT AND METHOD OF MANUFACTURING THE SAME

(75) Inventors: Francois Lechleiter, Favrieux (FR); Pierre-Alois Welsch, Paris (FR); Yannick de Maquille, Saint-Germain-en-Laye (FR)

(73) Assignee: Linxens Holding, Guyancourt (FR)

( * ) Notice: Subject to any disclaimer, the term of this patent is extended or adjusted under 35 U.S.C. 154(b) by 494 days.

(21) Appl. No.: 13/996,643

(22) PCT Filed: Dec. 14, 2011

(86) PCT No.: PCT/EP2011/072833
§ 371 (c)(1),
(2), (4) Date: Sep. 9, 2013

(87) PCT Pub. No.: WO2012/084662
PCT Pub. Date: Jun. 28, 2012

(65) Prior Publication Data
US 2014/0011309 A1    Jan. 9, 2014

(30) Foreign Application Priority Data
Dec. 22, 2010   (WO) ................. PCT/IB2010/003506

(51) Int. Cl.
| H01L 33/48 | (2010.01) |
| H05K 1/18 | (2006.01) |
| H05K 1/03 | (2006.01) |
| H01L 33/64 | (2010.01) |

(52) U.S. Cl.
CPC ............ *H01L 33/486* (2013.01); *H01L 33/64* (2013.01); *H05K 1/183* (2013.01); *H05K 1/189* (2013.01); *H01L 2224/48091* (2013.01); *H01L 2224/73265* (2013.01); *H05K 1/0393* (2013.01); *H05K 1/184* (2013.01); *H05K 2201/0355* (2013.01); *H05K 2201/0394* (2013.01); *H05K 2201/0397* (2013.01); *H05K 2201/10106* (2013.01)

(58) Field of Classification Search
None
See application file for complete search history.

(56) References Cited

U.S. PATENT DOCUMENTS

| 6,614,103 | B1 * | 9/2003 | Durocher | H01L 23/13 257/103 |
| 6,936,855 | B1 * | 8/2005 | Harrah | F21K 9/00 257/59 |
| 6,964,877 | B2 * | 11/2005 | Chen | H01L 24/97 438/106 |
| 7,095,053 | B2 * | 8/2006 | Mazzochette | H01L 25/0753 257/81 |
| 7,550,319 | B2 * | 6/2009 | Wang | C03C 8/02 257/432 |
| 7,556,405 | B2 * | 7/2009 | Kingsford | F21S 4/20 361/600 |
| 7,710,045 | B2 * | 5/2010 | Schultz | H05K 1/0204 313/46 |
| 2003/0137839 | A1 * | 7/2003 | Lin | F21S 4/006 362/237 |
| 2006/0043401 | A1 * | 3/2006 | Lee | H01L 33/647 257/99 |
| 2007/0087472 | A1 * | 4/2007 | Huber | B81C 1/00007 438/106 |

(Continued)

FOREIGN PATENT DOCUMENTS

| EP | 0 338 641 A1 | 10/1989 |
| EP | 1 473 978 A1 | 11/2004 |
| EP | 1 744 376 A2 | 1/2007 |

*Primary Examiner* — Mary Wilczewski
*Assistant Examiner* — Erik T Peterson
(74) *Attorney, Agent, or Firm* — Harrington & Smith

(57) ABSTRACT

The inventions relates to a method of manufacturing a circuit incorporating a solid state light emitting component, the method including providing an insulating layer, producing at least one through hole in the insulating layer, providing a conductive layer, bonding a main surface of the conductive layer to the insulating layer, and positioning at least one solid state light emitting component in the hole of the insulating layer and connecting this component to the conductive layer.

11 Claims, 6 Drawing Sheets

(56) References Cited

U.S. PATENT DOCUMENTS

| | | | |
|---|---|---|---|
| 2007/0096272 A1 | 5/2007 | Wang | 257/675 |
| 2008/0157333 A1* | 7/2008 | Lin | H01L 21/563 257/687 |
| 2009/0174301 A1 | 7/2009 | Frey et al. | 313/1 |
| 2009/0201699 A1* | 8/2009 | Ohno | G02B 6/0083 362/634 |
| 2009/0226656 A1* | 9/2009 | Crandell | B32B 33/00 428/40.1 |
| 2009/0321760 A1 | 12/2009 | Kuhmann | |
| 2010/0155748 A1* | 6/2010 | Chan | H01L 33/62 257/89 |
| 2012/0074441 A1* | 3/2012 | Seo | H01L 27/153 257/91 |
| 2012/0092833 A1* | 4/2012 | Chang | H01L 33/642 361/710 |
| 2013/0092421 A1* | 4/2013 | Kajiya | H05K 1/0206 174/252 |
| 2013/0213697 A1* | 8/2013 | Palaniswamy | H01L 33/486 174/254 |

* cited by examiner

CIRCUIT FOR A LIGHT EMITTING COMPONENT AND METHOD OF MANUFACTURING THE SAME

FIELD OF THE INVENTION

The invention relates to a method of manufacturing a circuit having a light emitting component mounted thereon and to a circuit manufactured by way of this method.

BACKGROUND OF THE INVENTION

Light emitting components, and in particular solid state light emitting components, are more and more used in electronic devices. In a context of electrical power saving solid state light emitting components have proven to be able to deliver high amounts of light with low electrical power consumption. Further, technologies of solid state manufacturing have developed in the recent years to a point that light emitting components can now be obtained with a size of a few hundreds of micro-meters in the case of Surface Mounted components—SMCs—and even with a size of a few tens of micro-meters in the case of bare chips or dies. This has allowed high amounts of light emitting elements to be placed in a same appliance such as for example a lighting bulb or a lighting tube for domestic use.

Surface mount technology—SMT—is a method for constructing electronic circuits in which the components—usually called surface-mounted components or SMCs—are mounted directly onto the surface of a circuit such as a printed circuit board—PCB—. An electronic device so made is called a surface mounted device—SMD—. In the industry it has largely replaced the through hole technology construction method of attaching components with wire leads into holes in the circuit board. A surface mounted device is hence a type of circuit having electronic components mounted directly onto its surface.

An SMT component is usually smaller than its through-hole-wired counterpart because it has either smaller leads or no leads at all. It may have short pins or leads of various styles, flat contacts, a matrix of solder balls, or terminations on the body of the component.

Surface mount technology was developed in the 1960s and became widely used in the late 1980s. Part of those components were mechanically redesigned to have small metal tabs or end caps that could be directly soldered to the surface of a PCB. Components became much smaller and component placement on both sides of a board became far more common with surface mounting, allowing much higher circuit densities. Often only some solder joints hold the SMCs or a dot of adhesive may as well affix the SMC to the circuit.

Surface mounted devices (SMDs) are usually made physically small and lightweight for these different reasons. Surface mounting lends itself well to a high degree of automation, reducing labor cost and greatly increasing production rates. SMDs can be one-quarter to one-tenth the size and weight, and one-half to one-quarter the cost of equivalent through-hole-wired parts.

In a context of multiplying information devices such as smart phones, flat screen televisions, intelligent automobile conductor boards, and many other apparatuses that may visually display information, light emitting components are more and more adopted in everyday appliances thanks to their low size and low consumption.

Despite the many progresses made in the field of light emitting components, these components remain however a source of heat and hence there remains a need for handling dissipation of heat in devices where such elements are used. This constraint is still more accurate when a large number of light emitting components are used in a same product.

The invention aims at proposing a solution so as to ease thermal transfers away from a light emitting component in a circuit and hence enable an enhanced heat dissipation out of a circuit incorporating a light emitting component. The invention also aims at proposing such a solution that remains adapted to an industrial process and does not induce heavy costs when implemented in such process.

This goal is achieved according to the invention thanks to a method of manufacturing a circuit incorporating a solid state light emitting component, the method comprising:
  providing an insulating layer,
  producing at least one through hole in the insulating layer,
  providing a conductive layer,
  bonding a main surface of the conductive layer to the insulating layer,
  positioning at least one solid state light emitting component in the hole of the insulating layer and connecting this component to the conductive layer.

The invention also relates to a circuit incorporating a solid state light emitting component, the circuit comprising an insulating layer, said insulating layer having two opposite sides and at least one hole extending from one side to the other side of the insulating layer, the circuit also comprising a conductive layer, a main surface of the conductive layer being bonded to the insulating layer, characterized in that the solid state light emitting component is placed in the said at least one hole of the insulating layer and the solid state light emitting component is connected to the conductive layer.

BRIEF DESCRIPTION OF THE DRAWINGS

Other characteristics and advantages of the invention will readily appear from the following description of one of its embodiments, provided as a non-limitative example, and from the accompanying drawings.

On the drawings.

On the different figures, the same reference signs designate like or similar elements.

DETAILED DESCRIPTION

Figure 1:
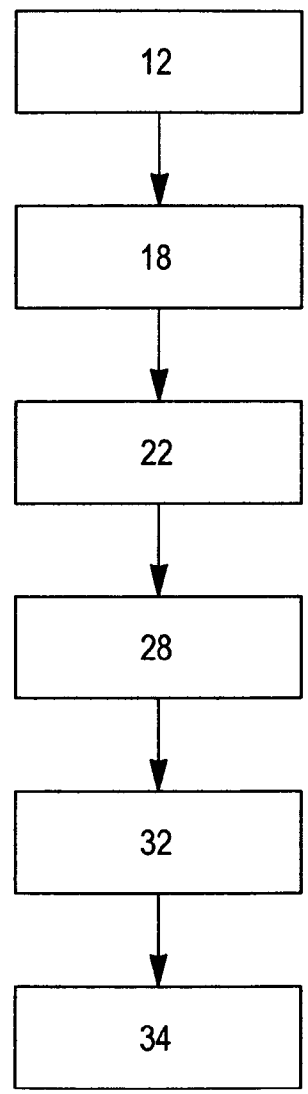
FIG. 1 is a flow chart illustrating the manufacturing steps in an embodiment of the method according to the invention.
Figure 2:
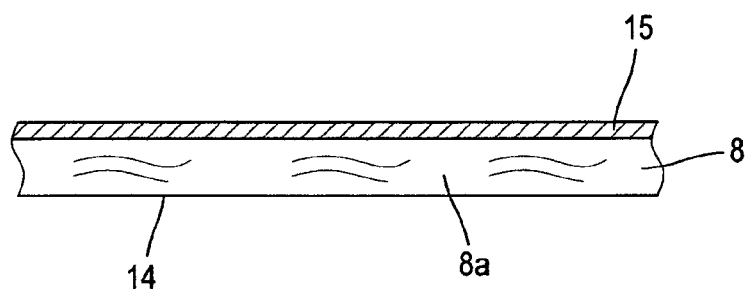
FIGS. 2 to 8 are cross-sectional schematic views of a part of a circuit according to an embodiment of the invention at different manufacturing steps.
Figure 3:
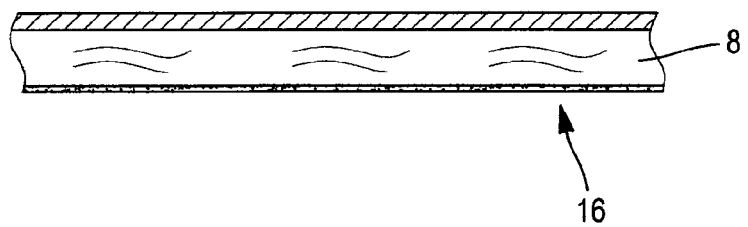
Figure 4:
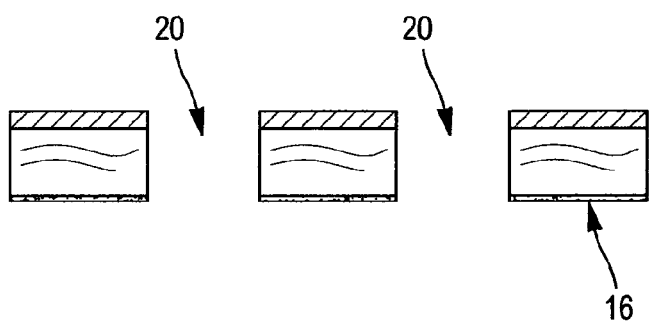
Figure 5:
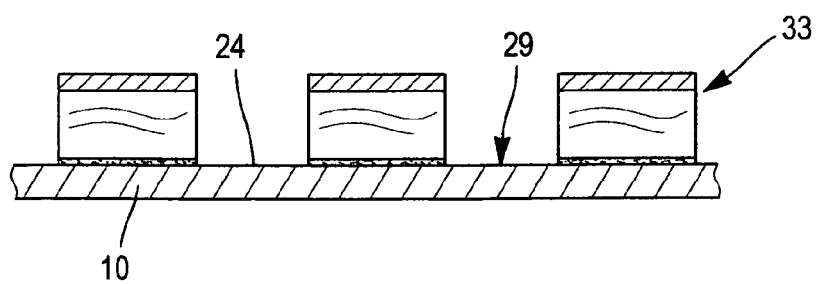
Figure 6:
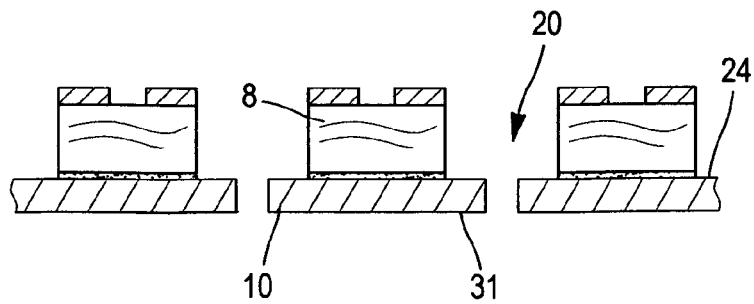
Figure 7:
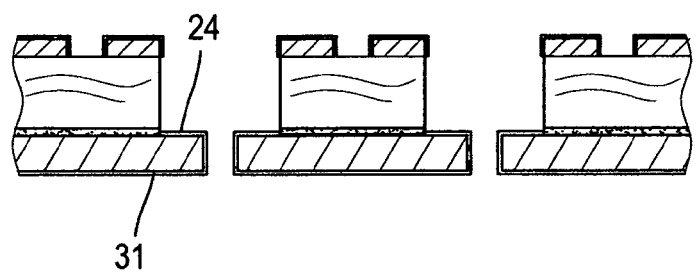
Figure 8:
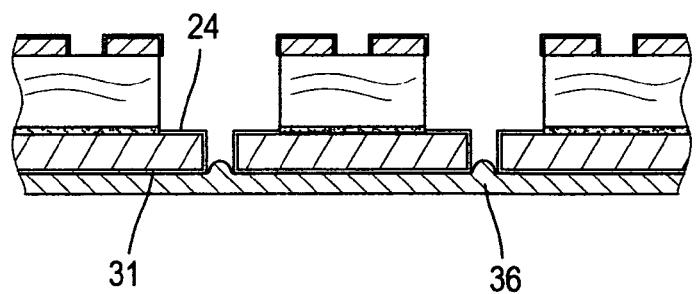

With reference to FIG. 1, the manufacturing method according to the invention begins with a step 12 of spreading glue 16 on a first main surface 14 of an insulating layer 8. Possibly, this insulating layer 8 is a copper clad laminate with a dielectric layer 8a and a copper layer 15.

The dielectric layer 8a is made of a dielectric polymeric material, for example, glass epoxy material. The dielectric layer 8a has for example a thickness in the range of 50 to 250 μm and more particularly in the range of 75 to 110 μm.

Then, at step 18, the insulating layer 8 is punched to produce through holes 20. Such holes have a size with the millimeter as an order of magnitude. For example, they are about 0.5 mm to 5 mm in size.

The holes 20 may alternatively be realised by mechanical methods, such as punching, drilling or water jet or by chemical methods such as etching or dissolving. Holes 20 may be realised by any other type of method such as by laser engraving.

At step 22, a main surface 24 of a conductive layer 10 is stacked on the glue-spread face 14 of the insulating layer 8 and is bonded to it by adhesion and lamination to produce a flexible band 33.

The conductive layer 10 is, for example, a flexible layer of copper having a thickness in the range of 10 to 105 μm.

As a result, at least one of the through-holes 20 is covered with the conductive layer 10. The through holes 20 are now blind holes having bottom regions 29 made of conductive material.

In the present example, the assembly comprising the conductive layer 20 and the insulating flexible layer 8 (for instance made of epoxy glass, polyimide, etc.) forms a flexible circuit, which is particularly adapted to be produced in a roll-to-roll process.

Preliminary to its fixation, the main surface 24 of the conductive layer 20 might be treated by suitable treatments. For instance, a deoxidization is performed before the bonding step 22. Bottom regions 29 of the conductive layer 20 are deoxidized, i.e., the regions of the main face 24 delimited by the through-holes are deoxidized.

At step 28, the conductive layer 10 is patterned, for example by screen printing, photoengraving or PCB milling to create an interconnection pattern, i.e. to create conductor pathways which will link the electronic components between them according to the desired electronic pattern.

At step 32, the flexible circuit and its copper conductive layer 10 are subjected to an electroplating process for producing a finishing treatment of conductive surfaces.

An electroplating deposition is realised on the copper layer 15 making part of the copper laminate clad, which copper layer 15 is at this stage on an upper side of the dielectric layer 8a which is opposite to a lower side of dielectric layer which is bonded to the copper conductive layer 10. Thanks to the electroplating of the upper copper layer 15 a high reflectivity is obtained in this area, which enhances the lighting ability of the assembly as a whole.

The electroplating is also realised onto the copper conductive layer 10, so that both copper layers 15 and 10 are protected against dirt and oxidation in particular during intermediary steps when the present assembly is stored waiting for further components to be placed onto the assembly as will be described here-under. The electroplating step 32 also provides a protection of the copper layers against aging due to exposure to light emitted by a light emitting component that will be described here-under and hence the electroplating contributes to make the assembly a long lasting device as required nowadays for lighting devices.

Preferably, electroplating is performed onto both the main surface 24 of the conductive layer 10 and onto a surface 31 of the conductive layer which is on an opposite side of the conductive layer 10.

At step 34, surface 31 of the conductive layer 10 which is opposite to the main surface 24 is further protected, for example, by applying a conformal coating 36. Conformal coating 36 is realized for example by dipping or spraying. Conformal coating 36 prevents corrosion and leakage of currents or shortenings between conductive paths of the conductive layer 10 due to condensation. It also insulates the copper layer and consequently the conductive tracks between the components and/or other electrical circuits from one another. This coating 36 is here electrically insulating and thermally conductive.

Hence by covering free spaces which are present between conductive pathways of the conductive layer 10, the conformal layer 36 forms a barrier against dust and moisture which would otherwise penetrate into the free spaces and would electrically bridge the pathways together.

Conformal coating 36 is here made of a glue which is electrically insulating. A glue thickness of 10-20 micrometers is adequate so that thermal transfers take place easily through the glue coating layer. In another embodiment the conformal coating 36 is made of a composite material comprising a base made of a plastic material and electrically conductive particles embedded in such base so that the composite as a whole is electrically insulating but is of enhanced thermal conductivity.

A heat sink is then affixed to the conformal coating 36, the conformal coating 36 hence insulating the pathways of the conductive layer 10 from the heat sink which here has a conductive surface in contact with the flexible assembly comprising the isolative layer and the conductive layer.

The heat sink may be a component available on the market, which is typically a metallic element, for example made of aluminium, either compact or made of a series of thin plates so as to provide a large area for thermal exchanges.

The conductive layer 10 and the insulating layer 8 are here obtained by being cut free from respective flexible bands, the assembly thereof being flexible also. Due to the flexible nature of the circuit, such embodiment of the invention can be easily implemented using a continuous a roll-to-roll process.

Figure 9:
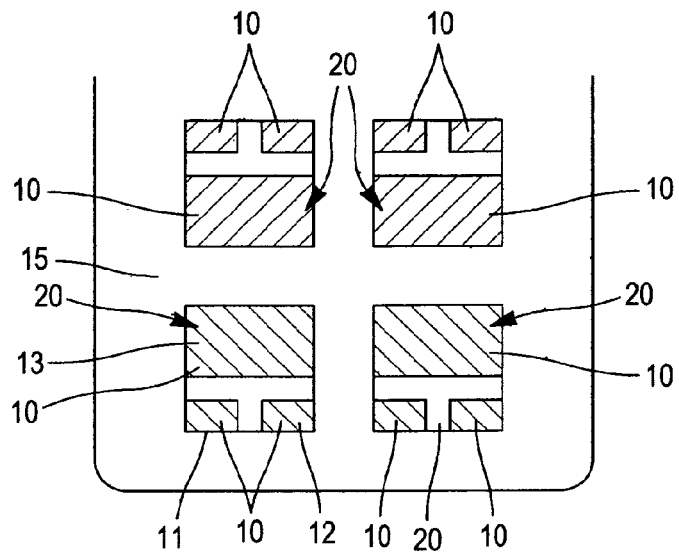
FIG. 9 is a top view of a portion of a flexible circuit according to an embodiment the invention.

A portion of a flexible circuit according to the invention is shown on FIG. 9. The top copper layer 15 covers the flexible dielectric layer. The conductive layer 10 is seen through the punched holes 20. The conductive layer 10 forms two contact pads 11, 12 and one thermal pad 13.

Figure 10:
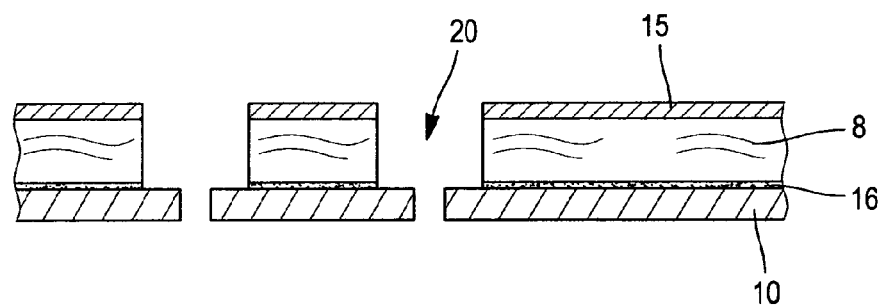
FIG. 10 is a schematic cross section of the structure of FIG. 9.

FIG. 10 shows a schematic cross section of the structure of FIG. 9. This structure corresponds to a flexible circuit which can be sold as such. A customer buying such a type of flexible circuit can choose the type of components he will place in the holes 20. However the flexible circuit described here is particularly suitable and adapted for receiving components 50 such as LEDs with three pads comprising two small electrical pads 51, 22 and one large thermal pad 54 such as represented on FIG. 12.

Figure 11:
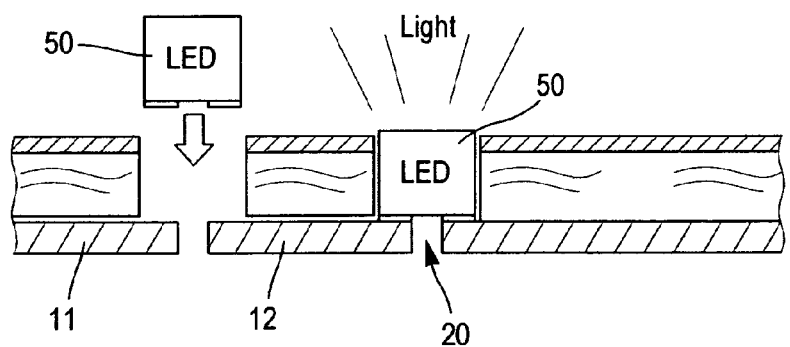
FIG. 11 is a schematic cross section of the structure of FIG. 10.

FIG. 11 shows a schematic cross section of the structure of FIG. 10 with one component 50 already in place in a hole 20 and one which is going to be placed in another hole. The component 50 is soldered to the copper pads 11, 12 and 13 by brazing with SnAgCu solder for instance.

At least one of the pads of the component is connected to one of the two main surfaces of the conductive layer whilst the other of the two main surfaces of the conductive layer is here designed to be placed in thermal conduction relationship with a heat sink. Consequently, the thermal energy can be very efficiently evacuated from the component to the heat sink through the conductive layer. The conductive layer is a made of a thermally and/or electrically conductive material. For instance, the conductive layer is made of a copper alloy. The same conductive layer is advantageously used for evacuating the thermal energy of a set of several such components as component 50.

In the present embodiment, the solid state light emitting component is a chip or bare chip.

The bare chip may also be called a die, due to the usual industrial process used for obtaining such a bare chip. Such usual process consists in producing large batches of a same circuit made of patterned diffusion of trace elements onto the surface of a thin wafer. The wafer is then cut ("diced") into many pieces, each containing one copy of the circuit. Each of these pieces hence constitutes a "die".

Figure 12:
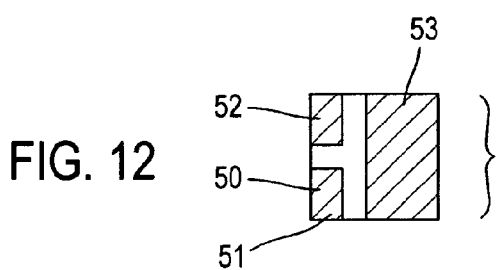
FIG. 12 is a bottom view of a component to be mounted onto the structure of FIG. 9.

The bare chip 50 of FIG. 12 is a flip chip whose pads 51, 52, 54 are adapted for direct connection of the chip to conductive pathways without intermediary wire-bonding.

Figure 13:
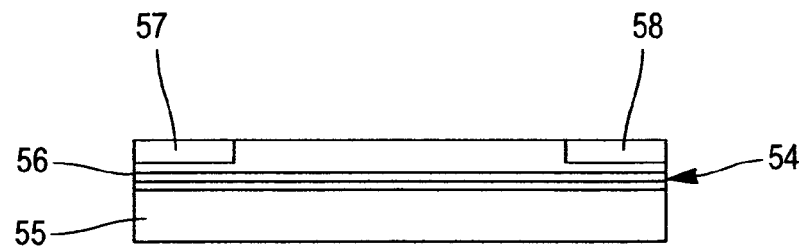
FIG. 13 depicts a bare chip used in an embodiment of the invention.

Such a bare chip or die is represented on FIG. 13. The light emitting bare chip 50 is made of a substrate 55 onto which a stack 56 of semi-conductor layers are deposited, which stack of layers 56 has the ability to emit light when a voltage is applied onto different layers of the stack. Such a bare chip is typically a few tens of micro-meters large, and the layers of the stack are typically a few nano-meters thick. For being able to contact the different layers of the stack separately and thereby apply a differential voltage in the stack 56, pads 57 and 58 are realised on a side of the bare chip 50 which is opposite to the side constituted by the substrate 55. These pads 57 and 58 are connected to two different layers of stack of layers 56 by means of electrical connections which are themselves realised by deposition. Due to the size of such a bare chip, the pads 57 and 58 have a size of a few tens of micro-meters, typically between 50 and 100 micro-meters.

Figure 14:
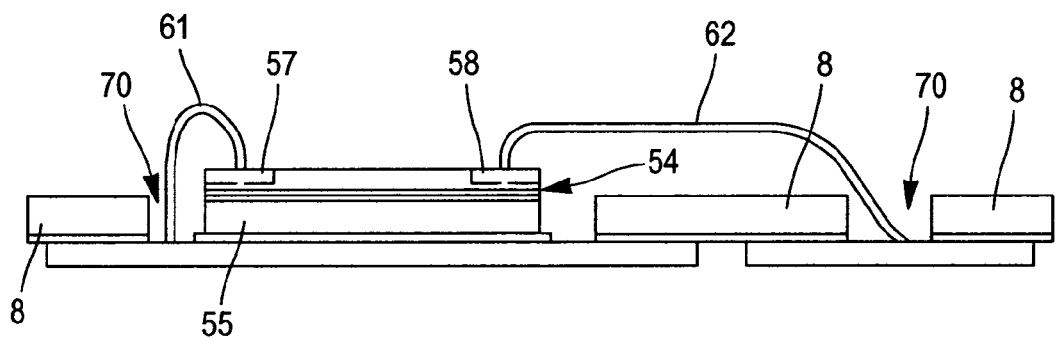
FIG. 14 depicts a wired bare chip according to an embodiment of the invention.

In the alternate embodiment of FIG. 14, the bare chip is connected to pathways of the conductive layer 10 by means of wires 61, 62 which are soldered to pads 57, 58 and connected by their opposite end to the conductive layer 10 through additional through hole 70 of the insulating layer 8.

In such case, the chip 50 may be placed in the hole 20 so that contact pads 51, 52, 54 of the chip are on the side of chip which is facing away from the conductive layer 10. The bonding wires 91, 62 then extend from theses pads 57, 58 and back to the conductive layer 10.

In an alternate embodiment, the solid state light emitting component is Surface Mount Component—SMC.

Figure 15:
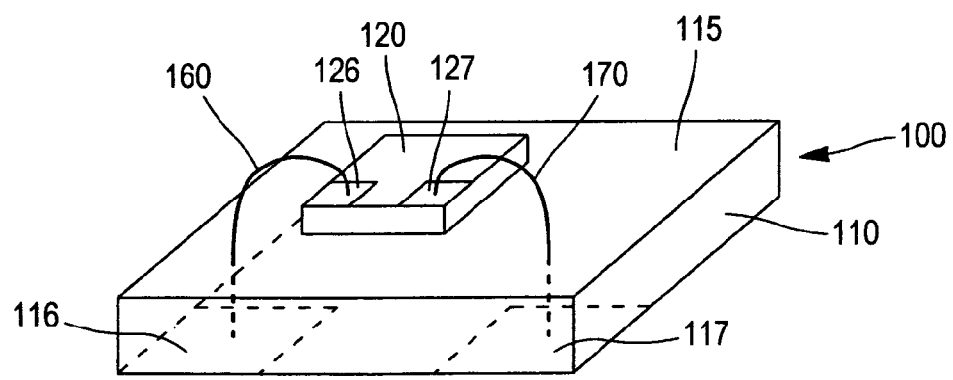
FIG. 15 is a partial perspective view of a surface-mounted-component used in an embodiment of the invention.

Such an SMC is represented on FIG. 15 under the general reference 100.

SMC 100 comprises a wafer element 110 and a bare chip 120 which is similar to the light emitting bare chip described above. The bare chip 120 is affixed to a first side 115 of the wafer element 110. The wafer element 110 carries conductive pads 116, 117 on a second and opposite side of the wafer element. Pads 126, 127 of the bare chip 120 are here directed so as to face away from the wafer element 110. Pads 126, 127 are connected to the pads 116, 117 of the wafer element 110 by means of connecting wires 160, 170. A non-represented encapsulating body is over-molded over the bare chip 120 and the bonding wires 160, 170 so that the surface mounted component 100 constitutes a protected and robust component able to be easily and directly mounted onto a support having conductive pathways.

The surface mounted component 100 has typically a size around half a millimeter. The pads 116, 117 of such a surface mounted component 100 are typically a few hundreds of micro-meters large. Connection of the surface mounted component 100 can be made by means of bonding wires, in particular when the surface mounted component is placed so that the pads of the surface mounted component face away from the wafer element 110. Connection of the surface mounted component 100 can also be made by placing the surface mounted component so that its pads 116, 117 come directly into contact with the conductive layer. The SMC may hence be connected to the conductive layer by being oriented so that the pads 116 and 117 are placed in the bottom of the cavity and come into contact with corresponding pathways of the conducting layer in the same way as described previously for a flip chip.

Although described as being entirely received inside a hole in the insulating layer, only part of the bare chip or of the SMC may be received in the hole, a lower part of the bare chip or SMC being inside an overall thickness of the hole while an upper part of the SMC emerges from the hole out of the insulating layer on the side of the insulating layer which is opposite to the side which is bonded to the conductive layer.

In both cases of a bare chip or a SMC, the solid state light emitting element is preferably electrically, thermally and mechanically connected to the conductive layer 10. In such case the product comprises a conductive layer and an insulating layer which are stacked and bonded together with one or more solid state light emitting elements which is/are electrically, thermally and mechanically linked to the conductive layer. When the conductive layer is electrically conductive, it may hence be also used for electrically connecting different components of the circuit between them or for electrically connecting components of the circuit with another electronic circuit.

Figure 16:
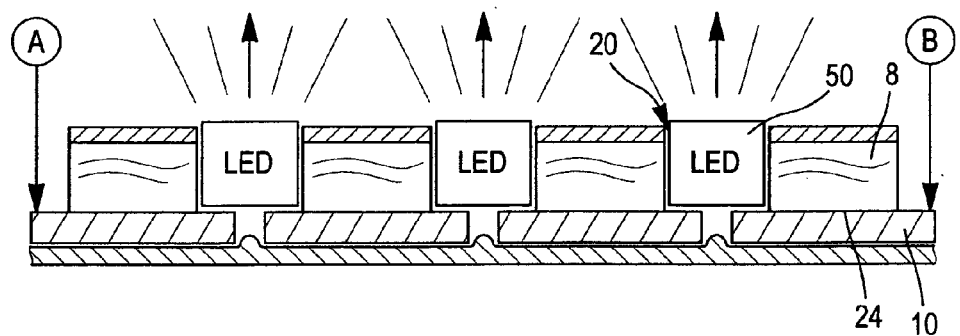
FIG. 16 is a schematic cross section similar to FIG. 11.
Figure 17:
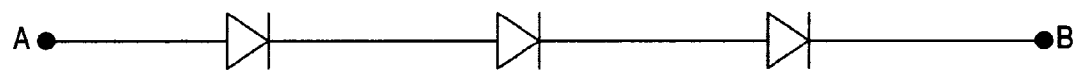
FIG. 17 shows schematically the electrical circuit of FIG. 16.

FIG. 16 shows a schematic cross section of a circuit according to the invention which is here a flexible circuit with three LEDs 50—Light Emitting Diodes—respectively constituted of such surface mounted components. The three LEDs are here mounted between two nods referenced as A and B as indicated also on the schematic representation of FIG. 17.

Figure 18:
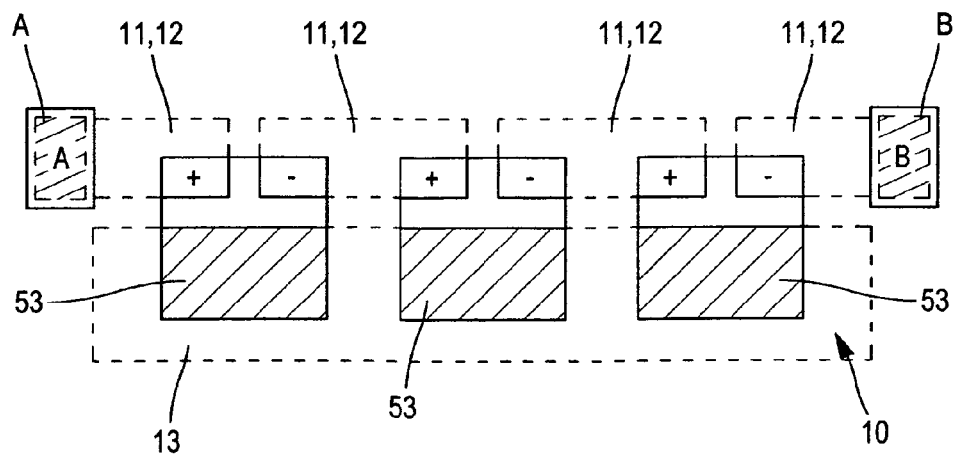
FIG. 18 shows electrical and thermal connections of the flexible circuit of FIG. 16.

FIG. 18 shows electrical and thermal connections of the same flexible circuit, between the electrical pads 51, 52 of the LEDs and portions or tracks 11, 12 of the conductive layer 10 and thermal connections of the thermal pads 53 of the LEDs with a same track 13 of the same conductive layer 10. Track 13 forms an extended element which covers the thermal pads 53 of the different LEDs 50 so as to collect the heat of the set of different LEDs of the circuit. The LEDs 50 being connected in series, a track 11 connected with a pad 51 of a LED constitutes also a track 12 which is connected with a pad 52 of an adjacent LED. However, a track 11, 12 is insulated from a same neighbour track 11, 12 and from the thermal track 13.

The invention claimed is:

1. A method of manufacturing a flexible circuit incorporating a solid state light emitting component, the method comprising:
   providing an insulating layer,
   producing at least one through hole in the insulating layer,
   providing a conductive layer, bonding a main surface of the conductive layer to the insulating layer, positioning at least one solid state light emitting component in the through hole of the insulating layer and connecting this component to the conductive layer;

wherein a portion of the flexible circuit comprises two contact pads and one thermal pad patterned in the conductive layer and partially covering said at least one through hole, the two contact pads spaced apart and separate from the thermal pad, and the at least one solid state light emitting component comprises contact pads and a thermal pad, said thermal pad of said at least one solid state light emitting component being connected to said one thermal pad patterned in the conductive layer.

2. The method according to claim 1, wherein the solid state light emitting component is a bare chip.

3. The method according to claim 1, wherein the step of producing at least one through hole in the insulating layer is performed preliminary to the bonding step so that the conductive layer covers the said at least one through hole of the insulating layer.

4. The method according to claim 1, wherein the conductive layer and the insulating layer are cut free from respective bands.

5. The method according to claim 1, wherein the connecting step comprises:

placing said at least one solid state light emitting component in said at least one through hole so that the contact pads and the thermal pad of the solid state component are connected with the conductive layer without wire-bonding.

6. The method according to claim 1, wherein the bonding and the through hole producing steps are performed repeatedly in at least one roll-to-roll apparatus.

7. The method according to claim 1, wherein an extended element is formed as a thermal pad patterned in the conductive layer which covers at least a portion of each thermal pad of different solid state light emitting components.

8. The method according to claim 1, wherein solid state light emitting components are connected in series with a track connecting to pads of adjacent solid state light emitting components, the track being insulated from a thermal track.

9. The method of claim 1, wherein a copper layer covers an upper side of the insulating layer which is opposite to a lower side of the insulating layer on which said conductive layer is bonded.

10. The method of claim 9, wherein an electroplating deposition is realized on the copper layer which covers an upper side of the insulating layer.

11. A flexible circuit incorporating a solid state light emitting component, the flexible circuit comprising an insulating layer, said insulating layer having two opposite sides and at least one through hole extending from one side to the other side of the insulating layer, the flexible circuit further comprising a conductive layer, a main surface of the conductive layer being bonded to the insulating layer, the solid state light emitting component being placed in the at least one through hole of the insulating layer and the solid state light emitting component being connected to the conductive layer, wherein the flexible circuit comprises two contact pads and one thermal pad patterned in the conductive layer and partially covering said at least one through hole, the two contact pads spaced apart and separate from the thermal pad, and the solid state light emitting component comprises two contact pads and a thermal pad, said thermal pad of said at least one solid state light emitting component being connected to said one thermal pad patterned in the conductive layer.

* * * * *